US008686630B2

(12) United States Patent
Hiyama et al.

(10) Patent No.: US 8,686,630 B2
(45) Date of Patent: Apr. 1, 2014

(54) ORGANIC ELECTROLUMINESCENCE ELEMENT AND ILLUMINATION DEVICE USING THE SAME

(75) Inventors: Kunimasa Hiyama, Tokyo (JP); Yasuo Taima, Tokyo (JP); Takeshi Ono, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/146,149

(22) PCT Filed: Feb. 3, 2010

(86) PCT No.: PCT/JP2010/051489
§ 371 (c)(1),
(2), (4) Date: Jul. 25, 2011

(87) PCT Pub. No.: WO2010/090207
PCT Pub. Date: Aug. 12, 2010

(65) Prior Publication Data
US 2011/0279024 A1    Nov. 17, 2011

(30) Foreign Application Priority Data
Feb. 9, 2009 (JP) ................................. 2009-027160

(51) Int. Cl.
*H01L 51/52* (2006.01)

(52) U.S. Cl.
USPC .......................................... 313/504; 313/512

(58) Field of Classification Search
USPC ............... 257/40, 72, 98–100, 642–643, 759; 313/498–512; 315/169.1, 169.3; 427/58, 64, 66, 532–535, 539; 428/690–691, 917; 438/26–29, 34, 82, 438/455; 445/24–25
See application file for complete search history.

(56) References Cited

U.S. PATENT DOCUMENTS

| 4,774,435 | A | 9/1988 | Levinson | |
|---|---|---|---|---|
| 7,973,475 | B2 * | 7/2011 | Kim et al. | 313/512 |
| 2004/0212296 | A1 * | 10/2004 | Nakamura et al. | 313/504 |
| 2005/0111085 | A1 | 5/2005 | Kato | |
| 2005/0142379 | A1 * | 6/2005 | Juni et al. | 428/690 |
| 2005/0236985 | A1 * | 10/2005 | Handa et al. | 313/511 |
| 2006/0049745 | A1 * | 3/2006 | Handa et al. | 313/503 |
| 2006/0186803 | A1 * | 8/2006 | Lim et al. | 313/506 |
| 2008/0218063 | A1 | 9/2008 | Greiner | |
| 2008/0237615 | A1 * | 10/2008 | Lee et al. | 257/89 |
| 2009/0026928 | A1 * | 1/2009 | Park et al. | 313/504 |
| 2009/0052195 | A1 * | 2/2009 | Saneto et al. | 362/355 |
| 2009/0072733 | A1 | 3/2009 | Funayama et al. | |

FOREIGN PATENT DOCUMENTS

| EP | 1-530-075 | 5/2005 |
|---|---|---|
| EP | 1-860-919 | 11/2007 |
| EP | 1-891-691 | 2/2008 |
| JP | 62-172691 | 7/1987 |
| JP | 11-067444 | 3/1999 |
| JP | 11-283751 | 10/1999 |
| JP | 2001-202827 | 7/2001 |
| JP | 2003-045643 | 2/2003 |
| JP | 2003-059642 | 2/2003 |
| JP | 2004-020746 | 1/2004 |
| JP | 2004-134158 | 4/2004 |
| JP | 2005-142002 | 6/2005 |
| JP | 2006-073636 | 3/2006 |
| JP | 2006-286616 | 10/2006 |
| JP | 2007-073465 | 3/2007 |
| JP | 2008-543074 | 11/2008 |
| WO | 2008/133285 | 11/2008 |

\* cited by examiner

*Primary Examiner* — Donald Raleigh
(74) *Attorney, Agent, or Firm* — Lucas & Mercanti, LLP

(57) ABSTRACT

Disclosed are an organic electroluminescence element with significantly improved light extraction efficiency and improved film properties and an illumination device that uses said element. The organic electroluminescence element has a transparent electrode, an organic electroluminescence layer, and a cathode sequentially stacked on a transparent base material. The element is characterized in that the transparent base material is a transparent resin film, there is a hard coat layer on both sides, the respective refractive indices satisfy the expressions (1)-(4), and there is a function to scatter light to the light emission side with respect to the organic electroluminescence layer. Expression (1): $-0.2 \leq n(H1)-n(A) \leq 0.2$, Expression (2): $-0.1 \leq n(H1)-n(B) \leq 0.1$, Expression (3): $-0.1 \leq n(H2)-n(B) \leq 0.1$, Expression (4): $-0.1 \leq n(H1)-n(H2) \leq 0.1$. In the expressions, n(A) is the refractive index of the transparent electrode; n(H1) is the refractive index of the hard coat layer (on the transparent electrode side); n(H2) is the refractive index of the hard coat layer (on the side opposite the transparent electrode); and n(B) is the refractive index of the transparent resin film.

9 Claims, No Drawings

ORGANIC ELECTROLUMINESCENCE ELEMENT AND ILLUMINATION DEVICE USING THE SAME

CROSS-REFERENCE TO RELATED APPLICATION

This is a 371 of PCT/JP2010/051489 filed Feb. 3, 2010, which in turn claimed the priority of Japanese Patent Application No. 2009-027160 filed Feb. 9, 2009, both applications are incorporated by reference herein.

FIELD OF THE INVENTION

This invention relates to an organic electroluminescence element and an illumination device using the same.

TECHNICAL BACKGROUND

As an emission type electronic displaying device, there is an electroluminescence display (hereinafter referred to as ELD). As element constituting the ELD, there are mentioned an inorganic electroluminescence element and an organic electroluminescence element. The inorganic electroluminescence element has been used for a plane-shaped light source, but a high voltage alternating current has been required to drive the element. An organic electroluminescence element (hereinafter also referred to as organic EL element) has a structure in which a light emission layer containing a light emission compound (organic compound thin layer containing fluorescent organic compound) is sandwiched between a cathode and an anode, and an electron and a hole were injected into the light emission layer and recombined to form an exciton. The element emits light, utilizing light (fluorescent light or phosphorescent light) generated by inactivation of the exciton. To utilize the emitted light, at least one of the electrodes each arranged at both sides of the organic compound thin layer is usually a transparent electrode such as ITO. The transparent electrode is supported by a transparent substrate such as a glass plate.

The organic electroluminescence element is noted from the viewpoint of the portability and space saving since the element can emit light at a low voltage within the range of from several to several decade volts and has a wide viewing angle and a high visuality since the element emits light itself and is complete solid thin layer shaped element.

However, development of an organic electroluminescence element for practical use is required which efficiently emits light with high luminance at a lower power.

The organic electroluminescence element has a problem of low output coefficient of light (a ratio of energy coming out of a substrate to emitting energy) for improving performances thereof. Namely, the light is largely lost when the light is conducted from the light emission layer to the light conversion member since the light emitted from the light-emitting layer has no directivity and scatters in all directions. Accordingly, the intensity of the light is made insufficient and the displayed image becomes too dark.

The light from the light emission layer only emitted to the front direction is utilized. Since the output coefficient of light to the front direction (the light emission coefficient) can be approximated by $1/2n^2$ according to the classical optics, the output coefficient of light to the front direction is defined by the refractive index n of the light emission layer. The light emitting coefficient of the organic electroluminescence member is about 20%, when the refractive index of the light emission layer is 1.7. The light other than the above is transported in the area direction of the light emission layer (the scatter in the side direction), or disappeared in the metal electrode facing to the transparent electrode through the light emission layer (an absorption to the rear direction). That is to say that, in the organic electroluminescence element, light is emitted in a layer whose refractive index (the refractive index is about 1.7 to 2.1) is higher than that of air, and only 15 to 20% of the light emitted in the light emission layer can be extracted. This is because light which enters a boundary (a boundary between a transparent substrate and the atmosphere) at an angle θ larger than a critical angle is totally reflected and cannot be extracted from the element, or because light is totally reflected at a boundary between the transparent substrate and the transparent electrode or between the transparent substrate and the light emission layer, so that the light exits from the side of the element through the transparent electrode or the light emission layer.

Several methods were investigated for improving this output coefficient of light. For example, as methods to improve the light extraction efficiency, there are a method to form concavity and convexity on the surface of the transparent substrate to prevent total internal reflection at a boundary between the transparent substrate and atmospheric air (referred to Patent Document 1); a method to form a flat layer having an intermediate refractive index between the substrate and the light emission layer to form an anti-reflection layer (referred to Patent Document 2); a method to form a flat layer having a lower refractive index than a substrate glass between the substrate and the light emission layer (referred to Patent Document 3); and a method to form a diffraction lattice at a boundary between any two of the substrate, the transparent electrode and the light emission layer (including a boundary between the substrate and atmospheric air) (referred to Patent Document 4).

In a method of forming concavity and convexity on a surface of a transparent substrate or a diffraction grating, the asperity is generally formed by etching using photolithographic technique, however, it results in low productivity and high cost. Further, in a method of forming a flat layer having intermediate refractive index or a method of introducing a flat layer having lower refractive index than a substrate glass between a substrate glass and a light-emitting member, a boundary having different refractive indexes exists after all, resulting in poor improvement in an output coefficient of light.

As simpler method than above, investigated was a method in which a film having a gradient refractive index structure between a transparent substrate and a transparent electrode was formed (referred to Patent Document 5). However, in this method, since a ratio of two components is needed to be changed continuously so as to forming a gradient refractive index structure, it causes non-uniformity in a film stress and may result in a fatal defect in a film property such as crack or peeling of film.

According to the present invention, on of features is to employ a transparent resin film as a substrate. In order to maintain a flexibility of the transparent substrate as well as an abrasion resistance, a film adhesion and anti-curling, required is to employ hard coats on both surfaces. Therefore, it was found to be important to balance refractive indexes or thickness between these 4 layers as the transparent resin film, two hard coat layers, and the transparent electrode layer.

PRIOR TECHNICAL DOCUMENT

Patent Document

Patent Document 1: U.S. Pat. No. 4,774,435
Patent Document 2: Unexamined Japanese Patent Application Publication (hereinafter referred to as JP-A) No. 62-172691
Patent Document 3: JP-A No. 2001-202827
Patent Document 4: JP-A No. 11-283751
Patent Document 5: JP-A No. 2007-73465

SUMMARY

Problems to be Solved by the Present Invention

In view of the foregoing, the present invention was achieved. An object of the present invention is to provide electroluminescence element with significantly improved light extraction efficiency and improved film properties and an illumination device that uses said element.

Means to Solve the Problems

The above object has been attained by the following constitutions:

1. An organic electroluminescence element comprising a transparent substrate sequentially provided thereon, a transparent electrode, an organic electroluminescence layer and a cathode, wherein the transparent substrate is a transparent resin film having a hard coat layer on both sides, each refractive index of the hard coat layers satisfies Expressions (1)-(4), and the transparent substrate has a function to scatter aa light to the light emission side with respect to the organic electroluminescence layer;

$$-0.2 \leq n(H1)-n(A) \leq 0.2 \quad \text{Expression (1)}$$

$$-0.1 \leq n(H1)-n(B) \leq 0.1 \quad \text{Expression (2)}$$

$$-0.1 \leq n(H2)-n(B) \leq 0.1 \quad \text{Expression (3)}$$

$$-0.1 \leq n(H1)-n(H2) \leq 0.1, \text{ wherein} \quad \text{Expression (4)}$$

n(A) is a refractive index of the transparent electrode;
n(H1) is a refractive index of the hard coat layer (on the transparent electrode side);
n(H2) is a refractive index of the hard coat layer (on an opposite side to the transparent electrode); and
n(B) is a refractive index of the transparent resin film.

2. The organic electroluminescence element of item 1, wherein the hard coat layer comprises a resin containing microparticles having a particle diameter of 1-400 nm in an amount of 5-30% by volume.
3. The organic electroluminescence element of item 2, wherein the resin is a curable resin.
4. The organic electroluminescence element of any one of items 1 to 3, wherein the hard coat layer comprises a light scattering filler.
5. The organic electroluminescence element of any one of items 1 to 4, wherein the transparent resin film is a film containing a light scattering filler.
6. The organic electroluminescence element of any one of items 1 to 5 comprising a light extraction film on the side opposite the transparent electrode on the transparent substrate.
7. The organic electroluminescence element of any one of items 1 to 6, wherein the transparent resin film is a polyester film.
8. The organic electroluminescence element of any one of items 1 to 6, wherein the transparent resin film is a stretched polyethylene naphthalate film.
9. The organic electroluminescence element of any one of items 1 to 8, wherein
a thickness of the hard coat layer is not less than 2 µm and not more than 50 µm, and satisfies Expressions (5)-(7):

$$d(H1)>d(A) \quad \text{Expression (5)}$$

$$d(H1)<d(B) \quad \text{Expression (6)}$$

$$-10 \text{ µm} \leq d(H2)-d(H1) \leq +10 \text{ µm, wherein} \quad \text{Expression (7)}$$

d(A) is a thickness of the transparent electrode;
d(H1) is a thickness of the hard coat layer (on the transparent electrode side);
d(H2) is a thickness of the hard coat layer (on an opposite side to the transparent electrode); and
d(B) is a thickness of the transparent resin film.

10. An illumination device comprising the organic electroluminescence element of any one of items 1 to 9.

Effects of the Invention

The present invention can provide an electroluminescence element and an illumination device that uses said element which results in significantly improved light extraction efficiency and improved film properties.

PREFERRED EMBODIMENT OF THE INVENTION

The present invention and the components thereof will now be detailed.

An object of the present invention is to provide an organic electroluminescence element and an illumination device that uses said element which results in significantly improved light extraction efficiency and improved film properties by satisfying the following relations.

$$-0.2 \leq n(H1)-n(A) \leq 0.2 \quad \text{Expression (1)}$$

$$-0.1 \leq n(H1)-n(B) \leq 0.1 \quad \text{Expression (2)}$$

$$-0.1 \leq n(H2)-n(B) \leq 0.1 \quad \text{Expression (3)}$$

$$-0.1 \leq n(H1)-n(H2) \leq 0.1, \quad \text{Expression (4)}$$

wherein n(A) is the refractive index of the transparent electrode; n(H1) is the refractive index of the hard coat layer (on the transparent electrode side); n(H2) is the refractive index of the hard coat layer (on the opposite side to the transparent electrode); and n(B) is the refractive index of the transparent resin film.

When a transparent resin film is employed as a substrate, a layer for securing physical properties such as a hard coat layer is required for a purpose of securing various physical properties such as abrasion resistance, curling property or adhesion to a transparent electrode. As a result, comparing to a case of employing a transparent glass plate, required are much layers having different refractive indexes, thereby results in increasing a possibility to occur total reflections at boundaries. By designing the balance between refractive indexes of each layer so as to satisfy above relations, light extraction efficiency can be improved even if employing the transparent resin film having improved physical property as the substrate.

In Expression (1), following Expression (1a) is preferable, and following Expression (1b) is more preferable.

$$-0.1 < n(H1) - n(A) < 0.1 \quad \text{Expression (1a)}$$

$$n(H1) \leq n(A) \quad \text{Expression (1b)}$$

In Expression (2) and Expression (3), following Expression (2a) and Expression (3a) is preferable, and following Expression (2b) and Expression (3b) is more preferable.

$$-0.05 < n(H1) - n(B) < 0.05 \quad \text{Expression (2a)}$$

$$-0.05 < n(H2) - n(B) < 0.05 \quad \text{Expression (3a)}$$

$$n(H1) \leq n(B) \quad \text{Expression (2b)}$$

$$n(H2) \leq n(B) \quad \text{Expression (3b)}$$

In Expression (4), following Expression (4a) is preferable, and following Expression (4b) is more preferable.

$$-0.05 < n(H1) - n(H2) < 0.05 \quad \text{Expression (4a)}$$

$$n(H1) = n(H2) \quad \text{Expression (4b)}$$

[Measurement Method for Refractive Index]

In the present invention, generally employed measurement method for refractive index can be employed. For example, the refractive index of each refractive index layer was determined based on the measured results of the reflectance of the sample which had been prepared by applying each of the several individual layers, while employing a spectrophotometer TYPE U-4000 (produced by Hitachi, Ltd.). The side of each sample, opposite the side to be measured, was subjected to a roughening treatment, and thereafter, the rear side was subjected to light absorption treatment employing a black spray, whereby light reflection from the rear surface was minimized. Subsequently, reflectance in the visible range (400-700 nm) was determined under the condition of 5-degree specular reflection.

[Transparent Resin Substrate]

[Transparent Resin Film]

As a transparent substrate according to an organic electroluminescence element of the present invention, employed is a transparent resin film. Specific examples for a transparent resin film includes such as film comprised of a polyester such as polyethylene terephthalate (PET) and polyethylene naphthalate (PEN); polyethylene, polypropylene, cellulose esters or cellulose ester derivatives such as cellophane, cellulose diacetate, cellulose triacetate, cellulose acetate butylate, cellulose acetate propionate (CAP), cellulose acetate phthalate, cellulose nitrate; poly vinylidene chloride, polyvinyl alcohol, polyethylene vinylalcohol, syndiotactic polystyrene, polycarbonate, norbornene resin, polymethyl pentene, polyether ketone, polyimide, polyether sulphone (PBS), polyphenylene sulfide, polysulphones, polyether imide, polyether ketone imide, poly amide, fluorine contained resin, nylon, polymethylmethacrylate, acrylates or polyacrylates, ARTON (Product by JSR Corporation), and cyclo olefin resin such as APEL (Product name by Mitsui Chemicals, Inc). Of these, it is preferable to use polyester films such as polyethylene terephthalate (PET) and polyethylene naphthalate, specifically preferable to use stretched polyethylene naphthalate in terms of heat resistance.

In the present invention, a refractive index of a transparent resin film is preferable not less than 1.60, specifically preferable not less than 1.70 and not more than 1.80.

In the present invention, a thickness of a transparent resin film is preferable not less than 50 μm and not more than 250 μm, but more preferable not less than 75 μm and not more than 200 μm.

[Hard Coat Layer]

In the present invention, a hard coat layer is provided on both sides of a transparent resin film, so as to enhance physical properties of the transparent film substrate such as an abrasion resistance and curling.

In the present invention, a hard coat layer is preferably constituted by a resin containing microparticles having average particle diameter of 1 nm-400 nm. The microparticles are preferably included in the hard coat on both sides.

In the present invention, microparticles having higher refractive index than a transparent resin are dispersed in the transparent resin to have average particle diameter of 1 nm-400 nm, whereby a transparent hard coat layer having a desired refractive index can be obtained.

A volume average particle diameter of the microparticles for the present invention is not more than 400 nm, more preferably not less than 1 nm and not more than 50 nm. When the average particle diameter is less than 1 nm, to disperse particles becomes difficult and it may cause difficulty to attain the desired performance, thereby the average particle diameter is preferable not less than 1 nm. On the contrary, when the average particle diameter exceeds 50 nm, a transparency of the obtained hard coat layer decreases by becoming cloudy in some cases depending on a refractive index difference, thereby the average particle diameter is preferable not more than 50 nm. Herein, the average particle diameter is referred to as volume mean value of a diameter when converting each particle into a sphere having the same volume of the particle (sphere conversion particle diameter).

Microparticles employed in the present invention preferably have a refractive index of 1.6 or more, more preferably 1.8 or more, still more preferably 2.0 or more. Specifically, oxide microparticles, metal salt microparticles and semiconductor microparticles are preferably employed. Of these, employed is one selected properly which does not cause absorption, emission or fluorescence in a wavelength range of optical element when necessary.

As oxide microparticles, employable are metal oxides which have one or two kinds of metal constituting a metal oxide selected from a group of Li, Na, Mg, Al, Si, K, Ca, Sc, Ti, V, Cr, Mn, Fe, Co, Ni, Cu, Zn, Rb, Sr, Y, Nb, Zr, Mo, Ag, Cd, In, Sn, Sb, Cs, Ba, La, Ta, Hf, W, Ir, Tl, Pb, Bi, and rare-earth metals. Specific examples include particles and complex particles satisfying 1.6 or more refractive index, such as titanium oxide, zinc oxide, aluminum oxide (alumina), zirconium oxide, hafnium oxide, niobium oxide, tantalum oxide, magnesium oxide, barium oxide, indium oxide, tin oxide, and lead oxide; and complex oxides constituted by above oxide such as lithium niobate, potassium niobate, lithium tantalite, and aluminum-magnesium oxide ($MgAl_2O_4$).

Further, as oxide microparticles, rare-earth oxides are employable. Specific examples include: scandium oxide, yttrium oxide, lanthanum oxide, cerium oxide, praseodymium oxide, neodymium oxide, samarium oxide, europium oxide, gadolinium oxide, terbium oxide, dysprosium oxide, holmium oxide, erbium oxide, thulium oxide, ytterbium oxide and ruthenium oxide.

As metal salt microparticles, employable are carbonate, phosphate, sulfate and complex particle thereof satisfying 1.6 or more refractive index. Further, Ti or Zr oxo-cluster is also employable.

As a method for preparing these inorganic microparticles, microparticles can be produced by spraying a raw material of inorganic particle in gas phase followed by calcinations. Further, preferably employable are methods in which particles are prepared by using plasma, by microparticulating solid raw material via abrasion using such as laser, or by oxidizing a vaporized metal gas. As a method in a liquid phase, inorganic microparticle dispersion liquid can be prepared by sol-gel method using alkoxide or chloride solution as a raw material in which particles are almost dispersed in a state of primary particles. Or a dispersion having uniform particle size can be prepared by using reaction crystallization which utilize lowering solubility.

It is preferred to fulfill a function of inorganic particles stably by drying and calcining particles obtained in liquid phase. In drying, freeze drying, spray drying or supercritical drying are applicable. As for calcinations, not only merely to keep high temperature under controlling an ambient condition but it is preferable to incorporate organic or inorganic anti-sintering agent.

Of these particles, following inorganic particles are preferred in view of selecting low cost, safety and easy to have small size particles. Namely, it is specifically preferred to use $TiO_2$, $Al_2O_3$, $LiNbO_3$, $Nb_2O_5$, $ZPO_2$, $Y_2O_3$, $MgO$, $ZnO$, $SnO_2$, $Bi_2O_3$, ITO, $CeO_2$, AlN, diamond, and $KTaO_3$.

The content of the inorganic particles is not limited. When an inorganic particles having 50 nm or less are filled into a resin, it is practically difficult to exceed the content of the inorganic particles 30% by volume. Considering securing moldability such as fluidity or without cracking, it is preferably 25% or less by volume. On the contrary, so as to change an optical property (refractive index) by filling inorganic particles, it requires a certain amount of filling fraction, preferably 5% or more by volume, more preferably 10% or more by volume. Herein, a volume fraction of inorganic particles is calculated by Expression: $(x/a)/Y \times 100$, provides that a is a specific gravity of inorganic particles, x is a content in gram, and Y is a total volume of resin in the prepared resin composition containing microparticles. The content of the inorganic particles can be determined by the observation by a transmission electron microscope (TEM) (information regarding the composition of the particle can be also obtained by local element analysis by EDX), or can be calculated from the containing weight of the designated particle component determined by the elemental analysis of the ash contained in the resin composition and the specific gravity of the crystal of the particle component. Accompanying filling inorganic particles, an increase of refractive index against the original resin is preferably 0.02 or more, more preferably 0.05 or more.

<<Surface Treatment Agent>>

In inorganic oxide particles according to the present invention, the surface is preferably subjected to a surface treatment so as to be mixed uniformly with resin by enhancing an affinity with a resin. Following methods are considered to introduce a bond between surface treating agent and surface of particle, however the present invention is not limited thereto.

A: physical absorption (surfactant treatment of secondary bonding)

B: reaction using surface chemical species (covalent bonding with hydroxyl group at surface)

C: introduction and reaction of active species to surface (introducing active point such as radical and graft polymerization, irradiation of high energy ray and graft polymerization)

D: resin coating (capsulation, plasma polymerization)

E: deposition immobilization (deposition of insoluble organic acid salt)

Specific examples are listed as follows:

(1) Silane Coupling Agent

Use of condensation or hydrogen bonding between silanol group and hydroxyl group at surface of particle such as vinyl silazane, trimethylchlorosilane, dimethyldichlorosilane, methyltrichlorosilane, trimethylalkoxysilane, dimethyldialkoxysilane, methyltrialkoxysilane; and hexamethyldisilazane. Of these, trimethylinethoxysilane, dimethyldimethoxysilane, methyltrimethoxysilane and hexamethyldisilazane are preferred.

(2) Other Coupling Agent

Titanate coupling agents, aluminate coupling agents and zirconate coupling agents are applicable. Further, zircoaluminate, chromate, borate, stannate and isocianate are applicable. Diketone coupling agents are also applicable.

(3) Surface Absorbent

Alcohol, nonionic surfactants, ionic surfactants, carbonic acids, and amines are applicable.

(4) Surface Treatment by Resins

There is a method in which after introducing an active species on the particle surface via method of above (1)-(3), polymer layer is formed on the surface by graft polymerization; or a method in which a preliminary synthesized polymer dispersant is absorbed and bonded to the particle surface. In view of forming strong bonded polymer layer onto the particle surface, graft polymerization is preferable, specifically preferred is to be grafted in high density.

<<Method for Manufacturing of Resin Containing Microparticles>>

Resin containing microparticles according to the present invention is manufactured at first by preparing a precursor for a composite material (in a state of melting in case of using thermoplastic resin, in a state of un-cured in case of using hardening resin) and then followed by coating on a substrate.

Specifically, in case of using hardening resin, a precursor for a composite material may be prepared by mixing a hardening resin dissolved in organic solvent and the microparticles of the present invention, followed by eliminating organic solvent; or may be prepared by adding and mixing the microparticles of the present invention into monomer solution which is one of a raw material of a hardening resin, followed by polymerization. Further, a precursor for a composite material may be prepared by melting olygomer in which monomer is partially polymerized or polymer of low molecular weight, and by adding and mixing the microparticles of the present invention thereto.

As organic solvent, selectable are lower alcohols having carbon number of 1-4, ketones such as acetone, methylethylketone, or methylisobutylketone, esters such as methyl acetate or ethyl acetate, and hydrocarbons such as toluene or xylene, however the present invention is not limited thereto, provided that it has lower boiling point than monomer and has compatibility with these monomers.

In the present invention, preferred is a method in which polymerization is carried out after adding the microparticles of the present invention into monomer solution. Specifically preferred is a method in which highly viscous solution by mixing monomer and the microparticles of the present invention is mixed with applying shear while cooling. It is also important to control viscosity so as to attain optimum condition for dispersing the microparticles of the present invention into hardening resin. Method for controlling viscosity includes a control of particle size, surface state and content of the microparticles of the present invention and addition of solvent or viscosity controlling agent. Since the microparticles of the present invention is easy to surface modification due to a structure thereof, optimum kneading state can be obtained by using thereof.

In the case of compositing by subjecting shear, the microparticles of the present invention can be added in a state of powder or in a coagulated state as it is. Further, the microparticles of the present invention are also possible to be added in a state of being dispersed in a liquid. In the case of adding the microparticles of the present invention in a state of being dispersed in a liquid, degassing is preferably performed after kneading.

In the case of adding the microparticles of the present invention into a liquid in a state of being dispersed, it is preferable to add coagulated particles by being dispersed to be primary particles in advance. For dispersion, various types of homogenizers can be utilized; however, a beads mill is specifically preferred. Beads may contain of various materials; however, the diameter is preferably small and specifically preferably 0.001-0.5 mm based on a diameter.

Microparticles of the present invention are preferably added by having been subjected to a surface treatment; however, employed may be a procedure such as integral blending in which the above-described surface treatment agent and the microparticles of the present invention are simultaneously added and compositing is performed.

<<Resin Monomer>>

As the hard coat layer of the present invention, a hardening resin is preferably used. An actinic radiation curable resin is more preferably used. The actinic radiation curable resin refers to a resin containing, as a main component, a resin cured via crosslinking reaction by being exposed to actinic radiation such as UV radiation or electron beams. As actinic radiation curable resin, monomer having ethylenically unsaturated double bond is preferably employed, and a hard coat layer is provided by curing via exposure of actinic energy ray such as UV radiation and electron beams. As typical examples of such an actinic radiation curable resin, a UV radiation curable resin and an electron beam curable resin are cited. Of these, a resin cured via exposure of UV radiation id preferred.

<<Coating of Hard Coat Layer>>

From the viewpoint of providing the hard coat layer with adequate durability and impact resistance, optical property and physical property, the film thickness of the hard coat layer is preferably in the range of 1 µm-100 µm, more preferably 2 µm-50 µm. Hard coat layers are coated on both sides of the resin film. A ratio of coating thickness of the hard coat layer on the surface side (the transparent electrode side) to the hard coat layer on the rear side (the side opposite the transparent electrode) each may be arranged according to a balance of curling. A difference of the coating thickness between the hard coat layer on the surface side and on the rear side is preferably 10 µm or less. Further, in view of optical property, the coating thickness of the hard coat layer on the surface side is preferably thinner than the thickness of the transparent electrode and the resin film.

In view of improving optical property and physical property of the film, it is preferable to arrange the refractive index of the hard coat layer so as to have smaller differences between the refractive indexes of the transparent electrode and the resin film. The difference of the refractive indexes between the hard coat layer and the transparent electrode of the present invention is within ±0.2, more preferably ±0.15. The difference of the refractive indexes between the hard coat layer on the surface side and on the rear side and the transparent resin film of the present invention is within ±0.1, more preferably ±0.5. The difference of the refractive indexes between the hard coat layer on the surface side and on the rear side of the present invention is within ±0.1, more preferably having the same refractive indexes.

Hard coat layer can be coated by methods known in the art employing a gravure coater, a dipping coater, a reverse coater, a wire bar coater, a die coater, or an inkjet.

Light sources to cure layers of UV curable-resin by photo-curing reaction are not specifically limited, and any light source may be used as far as UV ray is generated. For example, a low-pressure mercury lamp, a medium-pressure mercury lamp, a high-pressure mercury lamp, an ultrahigh-pressure mercury lamp, a carbon arc lamp, a metal halide lamp and a xenon lamp may be utilized. The preferable irradiation quantity of light may be changed depending on the type of lump, however, it is preferably from 5 to 150 mJ/cm$^2$, and more preferably from 20 to 100 mJ/cm$^2$.

[Light Scatter Function]

On the light emission side of the organic electroluminescence element of the present invention, light scatter function is provided with the purpose of reducing a total reflection at the boundary which occurs when the light taken into the transparent substrate is extracted to outside. Light scatter function include a method of using a known light extraction film having light scatter function at the light emission side of the organic electroluminescence element, and a method of containing light scattering filler in the transparent substrate. In the case of containing light scattering filler in the transparent substrate, a hard coat layer or transparent film may be used as a layer which contains light scattering filler and well-known filler of inorganic compound or polymer may be used as light scatter filler. Specific examples of inorganic compound include silicon dioxide, titanium dioxide, aluminum oxide, zirconium oxide, calcium carbonate, talc, clay, fired kaolin, fired calcium silicate, hydrated calcium silicate, aluminum silicate, magnesium silicate, and calcium phosphate. Specific examples of polymer include silicone resin, fluorine resin and acrylic resin. Content of filler in the hard coat layer or transparent film is preferably 0.1 to 30% by mass, or may be arranged according to the degree of the light scattering.

[Transparent Electrode]

For the transparent electrode of the organic electroluminescence element, a metal, an alloy, or an electroconductive compound each having a high working function (not less than 4 eV), and mixture thereof are preferably used as the electrode material. Specific examples of such an electrode material include a metal such as Au, and a transparent electroconductive material such as CuI, indium tin oxide (ITO), SnO$_2$, or ZnO, and a material capable of funning an amorphous and transparent conductive layer such as IDIXO (In$_2$O$_3$—ZnO). In the present invention, the transparent electrode is preferably used as the anode. The anode may be prepared by forming a thin layer of the electrode material according to a depositing or spattering method, and by forming the layer into a desired pattern according to a photolithographic method. When a coatable material such as organic electro conductive compound is used, wet film forming method such as printing or coating method may be employable. The sheet resistance of the anode is preferably a few hundred Ω/□. Further, the thickness is ordinary within the range of 10-100 nm and preferably 10-200 nm, although it may vary due to kinds of materials used.

In the present invention, the refractive index of the transparent electrode is preferably not less than 1.5 and not inure than 2.0, more preferably not less than 1.6 and not more than 1.9.

According to the present invention, by optimizing the balance of refractive index and thickness of the transparent electrode, the hard coat layer and the transparent resin film, physical property of the layer in the organic electroluminescence element having fine layer structure can be extremely enhanced, as well as enhancing well-known light extraction efficiency.

[Organic Electroluminescence Element]

Preferred examples of the constituent layer of the organic electroluminescence element of the invention will be shown below.

(i): Anode/Light emission layer/Electron transporting layer/Cathode (ii): Anode/Hole transporting layer/Light emission layer/Electron transporting layer/Cathode (iii): Anode/Hole transporting layer/Light emission layer/Hole blocking layer/Electron transporting layer/Cathode (iv): Anode/Hole transporting layer/Light emission layer/Hole blocking layer/Electron transporting layer/Cathode buffering layer/Cathode (v): Anode/Anode buffering layer/Hole transporting layer/Light emission layer/Hole blocking layer/Electron transporting layer/Cathode buffering layer/Cathode Herein, Light emission layer preferably contains 2 or more kinds of light emission material at least having different emission color and may form a light emission layer unit comprising a plurality of light emission layers in a single layer. Further, Hole transporting layer includes Hole injecting layer and Electron blocking layer.

<<Light Emission Layer>>

The light emission layer in the invention is a layer where electrons and holes, injected from electrodes, an electron transporting layer or a hole transporting layer, are recombined to emit light. The portions where light emits may be in the light emission layer or at the interface between the light emission layer and the layer adjacent thereto.

The constitution of the light emission layer in the invention is not particularly limited, as long as contained light emission material satisfies the above described conditions.

Further, the light emission layer may have a plurality of layers having the same emission spectrum or emission maximum wavelength.

Between each light emission layers, it is preferable to provide a non-light emitting interlayer.

The total thickness of the light emission layer is preferably in the range of 1-100 nm, more preferably 30 nm or less in view of driving by lower driving voltage. Herein, the total thickness of the light emission layer refers to the thickness including the interlayer when the non-light emitting interlayer exists between the light emission layers.

Each thickness of the light emission layer is preferably adjusted to be in the range of 1-50 nm, more preferably 1-20 nm. The relation between the thickness of the each light emission layer of blue, green and red is not particularly limited.

Employing a light emitting material or a host compound each described later, the light emission layer is formed according to a known thin layer formation method such as a vacuum deposition method, a spin coat method, a casting method, an LB method or an ink jet method.

In the present invention, a plurality of light emitting materials may be mixed in each light emission layer. Further, phosphorescence emitting material and fluorescent emitting material may be employed in combination in the same light emission layer.

In the present invention, the light emission layer preferably constitutes a host compound and a light emitting material (also referred to as an emission dopant compound) and the light is preferably emitted from the light emitting material.

In the present invention, the host compound used in the light emission layer of the organic electroluminescence element is preferably a compound which has a phosphorescence quantum yield at room temperature (25° C.) of less than 0.1, more preferably a phosphorescence quantum yield of less than 0.01. Further, the content of the host compound in the light emission layer is preferably not less than 50% by volume.

Known host compounds may be used singly or as an admixture of plural kinds thereof. Usage of plural host compounds can adjust charge transfer, and obtain an organic electroluminescence element with high efficiency. Further, usage of plural light emitting materials described later can mix light with a different color, and can emit light with any color.

The host compound used in the present invention may be a conventional low molecular weight compound, a polymeric compound having a repeating unit or a low molecular weight compound (evaporation-polymerizable emission host) with a polymerizable group such as a vinyl group or an epoxy group.

The known host compound used in combination is preferably a compound with high Tg (glass transition temperature), which has a hole and electron transporting ability, and prevents the emission wavelength shifting to longer wavelength. Herein, the glass transition temperature (Tg) is referred to as a value determined by using DSC (Differential Scanning Colorimetry) based on JIS-K-7121.

Specific examples of the known host compound include those described in the following Documents. For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Subsequently, the light emitting material will be explained.

As the light emitting material in the present invention, a fluorescent compound or a phosphorescence emitting material (also referred to as a phosphorescent compound or a phosphorescence emitting compound) can be used.

The phosphorescence emitting material in the present invention is a compound which emits light from the excited triplet, can emit phosphorescence at room temperature (25° C.), and has a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescence emitting material in the invention is a compound, in which the phosphorescent quantum yield measured employing any one of the solvents satisfies the above-described definition (not less than 0.01).

The light emission of the phosphorescence emitting material is divided in two types in principle, one is an energy transfer type in which recombination of a carver occurs on the host to which the carrier is transported to excite the host, the resulting energy is transferred to the phosphorescence emitting material, and light is emitted from the phosphorescence emitting material, and the other is a carrier trap type in which recombination of a carrier occurs on the phosphorescence emitting material, a carrier trap material, and light is emitted from the phosphorescence emitting material. However, in each type, it is necessary that energy level of the phosphorescence emitting material in excited state is lower than that of the host compound in excited state.

The phosphorescence emitting material is suitably selected from those used in the light emission layer of an organic electroluminescence element. The phosphorescence emitting material is preferably a metal complex containing a metal belonging to a group VIII to X of the periodic table, and is more preferably an iridium compound, an osmium compound, a platinum compound (a platinum complex) or a rare earth compound, and most preferably an iridium compound.

In the organic electroluminescence element of the present invention, a fluorescent emitting material may be used. Typical examples of the fluorescent emitting material (fluorescent dopant) include a coumarin dye, a cyanine dye, a chloconium dye, a squarylium dye, an oxobenzanthracene dye, a fluorescene dye, a rhodamine dye, a pyrylium dye, a perylene dye, a stilbene dye, a polythiophene dye and rare earth complex type fluorescent compound.

Further, well-known dopant may be employable to the present invention. Specific examples are disclosed in WO 00/70655, JP-A Nos. 2002-280178, 2001-181616, 2002-280179, 2001-181617, 2002-280180, 2001-247859, 2002-299060, 2001-313178, 2002-302671, 2001-345183 and 2002-324679, WO 02/15645, JP-A Nos. 2002-332291, 2002-50484, 2002-332292 and 2002-83684, Published Japanese Translation of PCT International Publication No. 2002-540572, JP-A Nos. 2002-117978, 2002-238588, 2002-170684 and 2002-352960, WO 01/93642, JP-A Nos. 2002-50483, 2002-100476, 2002-173674, 2002-359082, 2002-175884, 2002-363552, 2002-184582 and 2003-7469, Published Japanese Translation of PCT International Publication No. 2002-525808, JP-A No. 2003-7471, Tokuhyou 2002-525833, and JP-A Nos. 2003-31366, 2002-226495, 2002-234894, 2002-235076, 2002-241751, 2001-319779, 2001-318780, 2002-62824, 2002-100474, 2002-203679, 2002-343572 and 2002-203678.

In the present invention, 2 or more kinds of light emitting materials may be contained at least in one light emission layer. Concentration of the light emitting material in the light emission layer may be changed according to the depth direction of the light emission layer.

<<Interlayer>>

In the present invention, a non-light emitting interlayer (hereinafter also referred to as a non-dope region) may be provided between the light emitting layers.

The non-light emitting interlayer is a layer provided between the light emitting layers when there is a plurality of light emitting layers.

The thickness of the non-light emitting interlayer is preferably in the range of 1-20 nm, but is more preferably in the range of 3-10 nm to retard the mutual interaction, such as an energy transfer, between the adjacent light emitting layers and to result in no high load to electric current and voltage characteristics of organic electroluminescence elements.

Materials employed in the above non-light emitting interlayer may be the same as the host compounds of the light emitting layer or differ. However, it is preferable that they are the same as the host materials of at least one of two adjacent light emitting layers.

The non-light emitting interlayer may incorporate compounds which are common to those (for example, host compounds) of each of the non-light emitting layers and the emitting layers. By incorporating each of the common compounds (as used herein, "employing common host materials" refers to the case in which physicochemical characteristics such as phosphorescence emitting energy or the glass transition point are the same, or the case in which the molecular structure of the host compound is the same), the injection barrier between the light emitting layer and the non-light emitting layer is lowered, whereby it is possible to realize targeted effects in which even though the electric voltage and current change, it is easy to maintain a balance of positive hole and electron injection. Further, by employing, in the non-dope light emitting layer, host compounds which exhibit the same physical characteristics or have the same molecular structure as those of the host compounds incorporated in each of the light emitting layers, it is also possible to overcome major drawbacks during preparation of conventional organic electroluminescence elements such as troublesome element preparation.

In the organic electroluminescence element of the present invention, since host materials achieve transportation of carriers, materials are preferred which are capable of transporting carriers. Carrier mobility is employed as a physical characteristic to represent the transportability of carriers. It is commonly noted that the carrier mobility of organic materials depends on electric field strength. Since materials which highly depend on the electric field strength tend to destroy the balance of the infection and transportation of positive holes and electrons, it is preferable to employ, as the host materials, those of which mobility exhibits minimal dependence on the electric field strength.

Still further, in order to optimally regulate the positive hole and electron injection balance, also listed is a preferred embodiment in which the non-light emitting interlayer functions as the blocking layer described below, namely as a positive hole blocking layer and an electron blocking layer.

<<Injecting Layer: Electron Injecting Layer, Hole Injecting Layer>>

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication. Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 10-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injecting layer) is preferably very thin and has a thickness of preferably from 0.1 nm to 50 µm depending on kinds of the material used.

<<Inhibiting Layer: Hole Inhibiting Layer, Electron Inhibiting Layer>>

The inhibiting layer is a layer provided if necessary in addition to the fundamental constituent layer as described above, and is for example a hole inhibiting (hole blocking) layer as described in Japanese Patent O.P.I. Publication Nos. 11-204258, and 11-204359, and on page 237 of "Organic EL element and its frontier of industrialization" (published by NTS Corporation, Nov. 30, 1998).

The hole inhibiting layer is an electron transporting layer in a broad sense, and is comprised of material having an ability of transporting electrons but an extremely poor ability of transporting holes, which can increase a recombination probability of electrons and holes by transporting electrons and blocking holes. Further, the constitution of an electron transporting layer described later can be used in the hole inhibiting layer in the invention as necessary. The hole inhibiting layer is preferably provided to be in contact with a light emission layer.

On the other hand, the electron blocking layer is a hole transporting layer in a broad sense, and is comprised of material having an ability of transporting holes but an extremely poor ability of transporting electrons, which can increase a recombination probability of electrons and holes by transporting holes and blocking electrons. Further, the constitution of a hole transporting layer described later can be used in the electron inhibiting layer in the invention as necessary. The thickness of the hole inhibiting layer or electron transporting layer is preferably from 3 to 100 nm, and more preferably from 5 to 30 nm.

<<Hole Transporting Layer>>

The hole transporting layer is comprised of a hole transporting material having an ability of transporting holes, and a hole injecting layer and an electron blocking layer are included in the hole transporting layer in a broad sense. The hole transporting layer may be a single layer or plural layers.

The hole transporting material has a hole injecting ability, a hole transporting ability or an ability to form a barrier to electrons, and may be either an organic substance or an inorganic substance. Examples of thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer.

As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4''-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-type-Si and p-type-SiC are usable.

So-called p-type hole transporting materials as disclosed in JP-A No. 11-251067 or described in the literature of J. Huang et at (Applied Physics Letters 80 (2002), p. 139) are also applicable. In the present invention, these materials are preferably utilized since an emitting device exhibiting a higher efficiency is obtained.

The hole transporting layer can be formed by layering the hole transporting material by a known method such as a vacuum deposition method, a spin coat method, a casting method, an ink jet method, and an LB method. The thickness of the hole transporting layer is not specifically limited, but is ordinarily from 5 nm to 5 μm, and preferably from 5 to 200 nm. The hole transporting layer may be composed of a single layer structure comprising one or two or more of the materials mentioned above.

A positive hole transporting layer having high p-type property doped with impurity can be utilized. Example thereof includes those described in JP-A-H04-297076, JP-A-2000-196140, JP-A-2001-102175, and J. Appl. Phys., 95, 5773 (2004) and so on.

It is preferable in the invention to employ such a positive hole transporting layer having high p-type property, since a device with lower power consumption can be prepared.

<<Electron Transporting Layer>>

The electron transporting layer comprises a material (an electron transporting material) having an electron transporting ability, and in a broad sense refers to an electron injecting layer or a hole blocking layer. The electron transporting layer can be provided as a single layer or plural layers.

An electron transporting material (which serves also as a hole inhibiting material) used in a single electron transporting layer or in the electron transporting layer closest to the cathode in plural electron transporting layers has a function of incorporating electrons injected from a cathode to a light emission layer, and is selected from known compounds. Examples thereof include a nitro-substituted fluorene derivative, a diphenylquinone derivative, a thiopyran dioxide derivative, a carbodiimide, a fluorenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material. A polymer in which the material mentioned above is introduced in the polymer side chain or a polymer having the material as the polymer main chain can be also used.

A metal complex of an 8-quinolynol derivative such as aluminum tris-(8-quinolynol) ($Alq_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol)

(Znq$_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emission layer may preferably be employed as the electron transporting material. An inorganic semiconductor such as n-type-Si and n-type-SiC may also be used as the electron transporting material in a similar way as in the hole injecting layer and the hole transporting layer.

The electron transporting layer can be formed employing the above-described electron transporting materials and a known method such as a vacuum deposition method, a spin coat method, a casting method, a printing method including an ink jet method or an LB method. The thickness of electron transporting layer is not specifically limited, but is ordinarily from 5 nm to 5 μm, and preferably from 5 to 200 nm. The electron transporting layer may be composed of a single layer comprising one or two or more of the electron transporting material.

An electron transporting layer having high n-type property doped with impurity can be utilized. Example thereof includes those described in JP-A-H04-297076, JP-A-H10-270172, 2000-196140, JP-A-2001-102175, and J. Appl. Phys., 95, 5773 (2004) and so on.

It is preferable in the invention to employ such an electron transporting layer having high n-type property, since an element with lower power consumption can be prepared.

<<Cathode>>

On the other hand, for the cathode, a metal (also referred to as an electron injecting metal), an alloy, and an electroconductive compound each having a low working function (not more than 4 eV), and a mixture thereof is used as the electrode material. Specific examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide (Al$_2$O$_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide (Al$_2$O$_3$) mixture, lithium/aluminum mixture, or aluminum is suitable from the view point of the electron injecting ability and resistance to oxidation. The cathode can be prepared forming a thin layer of such an electrode material by a method such as a deposition or spattering method.

The sheet resistance as the cathode is preferably not more than several hundred Ω/□, and the thickness of the layer is ordinarily from 10 nm to 5 μm, and preferably from 50 to 200 nm. It is preferable in increasing the light emission efficiency that either the anode or the cathode of the organic electroluminescence element is transparent or semi-transparent.

After a layer of the metal described above as a cathode is formed to give a thickness of from 1 nm to 20 nm, a layer of the transparent electroconductive material as described in the anode is formed on the resulting metal layer, whereby a transparent or semi-transparent cathode can be prepared. Employing the cathode, a device can be manufactured in which both anode and cathode are transparent.

<<Light Takeout>>

It is generally said that, in the organic electroluminescence element, light is emitted in a layer whose refractive index (the refractive index is about 1.7 to 2.1) is higher than that of air, and only 15 to 20% of the light emitted in the light emission layer can be taken out. This is because the light which enters into the interface (interface of a transparent substrate and air) with the angle θ larger than a critical angle cannot be taken out of the device due to the total internal reflection, or because the light is totally reflected between the transparent substrate and the transparent electrode or between the transparent substrate and the light emission layer, so that the light gets away from the side of the device through the transparent electrode or the light emission layer.

Examples of a method to improve efficiency of the light takeout include a method to form concavity and convexity on the surface of the transparent substrate to prevent total internal reflection at the interface between the transparent substrate and air (for example, U.S. Pat. No. 4,774,435); a method to provide a light converging function to the substrate (for example, JP-A S63-314795); a method to provide a reflecting surface on the side of the element (for example, JP-A No. H01-220394); a method to provide a flat layer between the substrate and the light emission layer, the flat layer having an intermediate refractive index to form an anti-reflection layer (for example, refer to JP-A S62-172691); a method to provide a flat layer having a low refractive index between the substrate and the light emission layer (for example, JP-A 2001-202827); and a method to provide a diffraction grating between any of the substrate, transparent electrode and light emission layer (including the interlayer between the substrate and out side air) (for example JP-A H11-283751).

In the present invention, these methods can be used in combination with the organic electroluminescence element of the present invention. Also, a method of forming a flat layer having a lower refractive index than that of the substrate between the substrate and the light emission layer, or a method of funning a diffraction grating between any of the substrate, transparent electrode and light emission layer (including the interlayer between the substrate and out side air) can be preferably used.

In the present invention, an element exhibiting further higher luminance and durability can be obtained by combining these methods.

The takeout efficiency of light which comes out of the transparent electrode increases with decreasing the refractive index of the medium, when a low refractive index medium having a thickness greater than the wavelength of the light is formed between the transparent electrode and the transparent substrate.

As a low refractive index layer, aerogel, porous silica, magnesium fluoride and fluorine-containing polymer are cited, for example. Since the refractive index of the transparent substrate is generally 1.5 to 1.7, the refractive index of the low refractive index layer is preferably 1.5 or less and more preferably 1.35 or less.

The thickness of a low refractive index medium is preferably twice or more of the wavelength of the light in the medium, because when the thickness of the low refractive index medium is such that the electromagnetic wave exuded as an evanescent wave enters into the transparent substrate, the effect of the low refractive index layer is reduced.

A method to provide a diffraction gating at the interface where the total internal reflection occurs or in some of the medium has feature that the effect of enhancing the light takeout efficiency is high. The intension of this method is to take out the light which cannot come out due to such as total internal reflection between the layers among the light emitted in the light emission layer, by providing a diffraction grating between any of the layers or in any of the mediums (in the transparent substrate or in the transparent electrode), using the property of the diffraction grating that it can change the direction of light to a specific direction different from the direction of reflection due to so-called Bragg diffraction such as primary diffraction or secondary diffraction.

It is preferred that the diffraction grating to be provided has a two-dimensional periodic refractive index. This is because, since the light is emitted randomly to any direction, only the light proceeding to a specific direction can be diffracted when a general one-dimensional diffraction grating having a periodic refractive index distribution only in a specific direction is used, which does not greatly increase the light takeout efficiency. However, by using diffraction grating having a two-dimensional refractive index distribution, the light proceeding to any direction can be diffracted, whereby the light take out efficiency is increased.

The diffraction grating may be provided between any of the layers on in any of the mediums (in the transparent substrate or in the transparent electrode), but it is preferably provided in the vicinity of the organic light emission layer where the light is emitted.

The period of the diffraction grating is preferably about ½ to 3 times of the wavelength of the light in the medium.

The array of the diffraction grating is preferably two-dimensionally repeated, for example, as in the shape of a square lattice, a triangular lattice, or a honeycomb lattice.

<<Light-Condensing Sheet>>

In the organic electroluminescence element of the invention, luminance in a specified direction, for example, the front direction against the emitting plane of the device can be increased, for example, by processing to form a structure of a micro-lens array sheet on the light takeout side surface of the substrate or in combination with a so-called light-condensing sheet.

As an example of a micro-lens array, quadrangular pyramids 30 μm on a side and having a vertex angle of 90° are two-dimensionally arranged on the light takeout side surface of the substrate. The side of the quadrangular pyramids is preferably 10-100 μm. When the length of the side is shorter than the above range, the light is colored due to the effect of diffraction, and when it is longer than the above range, it becomes unfavorably thick.

As a light-condensing sheet, one practically applied for an LED backlight of a liquid crystal display is applicable. Examples of such a sheet include a brightness enhancing film (BEF) produced by SUMITOMO 3M Inc. As the shape of a prism sheet, one in which a triangle-shaped strip having a vertex angle of 90° and a pitch of 50 μm provided on a substrate, one having round apexes or one having a randomly changed pitch may be included.

In order to control an emission angle of emitting light from the light emitting element, a light diffusion plate or film may be used in combination with the light-condensing sheet. For example, a diffusion film (Light-Up) produced by KIMOTO Co., Ltd. can be used.

[Preparation Method of Organic Electroluminescence Element]

For one example, the preparation of the organic electroluminescence element, which has the constitution, Anode/Hole injecting layer/Hole transporting layer/Light emission layer/Electron transporting layer/Electron injecting layer/Cathode, will be described.

A thin layer of a desired material for an electrode such as a material of the anode is formed on a suitable substrate by a deposition or sputtering method to prepare the anode, so that the thickness of the layer is not more than 1 μm, and preferably within the range of from 10 to 200 nm. Then the hole injecting layer, the hole transporting layer, the light emission layer, the electron transporting layer and the electron injecting layer, which constitute the organic electroluminescence element, are formed on the resulting anode in that order as organic compound thin layers.

A thin layer forming method of these layers containing the organic substances includes an evaporation method and wet process such as a spin coat method, a cast method, an inkjet method, and a printing method as described before, however, a vacuum evaporation method or a spin coat method, an inkjet method and a printing method is specifically preferable with respect to easy preparation of a homogeneous layer and bare generation of pinholes. Further, a different layer forming method depending on each layer may be applied. In the case of employing an evaporation method in layer formation, the evaporation condition depends on such as the type of a utilized compound, however, is generally appropriately selected in a range of 50-450° C. as a boat heating temperature, $10^{-6}$-$10^{-2}$ Pa as a vacuum degree, 0.01-50 nm/sec as a deposition rate, −50-300° C. as a substrate temperature and 0.1 nm-5 μm, preferably 5-200 nm as a layer thickness.

After these layers has been formed, a thin layer comprised of a material for a cathode is formed thereon to prepare a cathode, employing, for example, a deposition method or sputtering method to give a thickness of not more than 1 μm, and preferably from 50 to 200 nm. Thus, a desired organic electroluminescence element is obtained. This preparation of an organic electroluminescence element is preferably carried out with one time evacuation to prepare all through from a hole injecting layer to a cathode, however, different layer forming method may be also applied by taking out the element on the way. At that time, it is preferable to take consideration such as to perform the operation under a dry inert gas environment.

Further, the organic electroluminescence element can be prepared in the reverse order, in which the cathode, the electron injecting layer, the electron transporting layer, the light emission layer, the hole transporting layer, the hole injecting layer, and the anode are formed in that order. When a direct current voltage, a voltage of 2 to 40 V is applied to the thus obtained multicolor liquid crystal display, setting the anode as a +polarity and the cathode as a −polarity, light emission occurs. An alternating voltage may be applied. The wave shape of the alternating current may be any one.

[Use]

The organic electroluminescence element of the invention can be used as a display device, a display, or various light emission sources. Examples of the light emission sources include a lamp such as a home use illumination, a car room illumination, a backlight for a watch or a liquid crystal, a light source for boarding advertisement, a signal device, a light source for a photo memory medium, a light source for an electrophotographic copier, a light source for an optical communication instrument, and a light source for an optical sensor, but are not limited thereto. Particularly, it is effectively used as a backlight for a liquid crystal display device in combination with color filter or a light source for illumination.

[Illumination Device]

The organic electroluminescence element of this invention can be also applied to an organic electroluminescence element to generate emission of practically white color as an illumination device. Plural emission colors are simultaneously emitted by plural number of emission materials to obtain white light by mixing colors. A combination of plural emission colors may be either the one, in which three emission maximum wavelengths of three primary colors of blue, green and red are contained, or the other, in which two emission maximum wavelengths, utilizing a relationship of complimentary colors such as blue and yellow, or blue and orange, are contained.

Further, a combination of light emission materials to obtain a plurality of emission colors may be either a combination comprising a plurality of light emitting materials (emission dopants) which emit phosphoresce or fluorescence, or a combination of a material which emits phosphoresce or fluorescence and a dye material which emits by light from the emission material as exiting light, however, in a white organic electroluminescent element according to this invention, it is preferable to mix a plurality of emission dopants in combination.

As the layer constitution of the organic electroluminescence device for obtaining the plural color lights, a method using the plural emission dopants contained in one light emission layer, a method using plural light emission layers each containing the dopant different in the wavelength of emitting light, respectively, and a method using fine pixels each different in the emitting light wavelength constituted into a matrix are cited.

In the organic electroluminescence element of the invention, patterning may be carried out through a metal mask or according to an ink-jet printing method. The patterning may be carried out only in electrodes, in both electrodes and light emission layer, or in all the layers of the device.

An emission material utilized in an emission layer is not specifically limited, and in the case of a backlight of a liquid crystal display element, any combination by arbitrary selection among platinum complexes according to this invention or emission materials well known in the art can be utilized so as to be fitted to the wavelength range corresponding to CF (color filter) characteristics, whereby white emission can be obtained.

In this manner, a white emitting organic electroluminescence element is usefully utilized as one type of a lamp such as a home use illumination, a car room illumination or an exposure light source as various emission light sources or illumination devices, in addition to the aforesaid display device and a display, and is further usefully applied for a display as such as a backlight of a liquid crystal display.

In addition to these, listed is a wide range of applications such as a backlight of a watch, an advertising board, a signal, a light source of an optical memory medium, a light source of an electrophotographic copier, a light source of an optical telecommunication processor and a light source of an optical sensor, and further general home use electric instruments which require a display device.

EXAMPLES

Preparation of Transparent Film 101 with Hard Coat Layer (Preparation of Zirconia Particle)

To a zirconium salt solution of 2600 g of zirconium oxychloride octahydride dissolved in 40 L of pure water was added diluted ammonia water of 340 g of 28% ammonium water dissolved in 20 L of pure water to prepare zirconia precursor slurry.

Subsequently, to the zirconia precursor slurry was added an aqueous sodium sulfate solution of 400 g of sodium sulfate dissolved in 5 L pure water, while stirring.

Then, using a drying machine, this mixture was dried at 120° C. in the atmosphere over 24 hrs to obtain a solid material.

Subsequently, the solid material was ground in an automatic mortar and burned at 500° C. over one hour in the atmosphere using an electric furnace. The thus burned material was fed into pure water and stored to form slurry. Then, the slurry was washed by using a centrifugal separator to remove the added sodium sulfate and dried in a drying machine to prepare zirconia particles 1. As a result of TEM observation, it was proved that the volume average particle diameter was 5 nm. From XRD, it was also proved that the particles were crystalline $ZrO_2$.

(Surface Treatment of Zirconia Particle)

To 100 ml of toluene containing 2 g of phenyltrimethoxysilane (produced by Shin-Etsu Chemical Co., Ltd.) and 0.1 g of methacryloxypropyltrimethoxysilane was added 10 g of the foregoing zirconia particle and heated to 100° C., while dispersing by using 0.03 mm zirconia beads under nitrogen to obtain a homogeneous dispersion. Thereafter, the dispersion was refluxed under nitrogen for 5 hours with heating to obtain a toluene dispersion of surface-treated zirconia particles.

(Dispersion of Particles in Resin)

A curable resin monomer (fluorene acrylate) was mixed with, the foregoing surface-treated zirconia particle dispersion (at an amount for a desired refractive index) by 30% by volume, followed by adding polymerization initiator to prepare monomer coating solution for hard coat layer.

(Hard Coat Layer)

Obtained monomer coating solution for hard coat layer was coated on both side of biaxially-stretched PEN film (produced by Teijin DuPont; refractive index of 1.75) having thickness of 125 μm, such that the thickness of the dry films becomes 5 μm followed by curing using ultraviolet ray irradiation to prepare Transparent Film 101 with Hard coat layer. The refractive index of the hard coat layer was 1.75.

<<Preparation of Transparent Films 102 to 108 and 110 to 123 with Hard Coat Layer>>

Transparent films 102 to 108 and 110 to 123 with hard coat layer were prepared in the same manner as Transparent Films 101 with hard coat layer, except for changing a content of $ZrO_2$ and a thickness of hard coat layer on both side as listed in Table 1. Transparent film 109 was biaxially-stretched PEN without hard coat layer. Further, biaxially-stretched PET film (produced by Konica Minolta; refractive index of 1.65) having thickness of 125 μm were employed as substrates for Transparent Films 117 to 123.

<<Evaluation of Transparent Films with Hard Coat Layer>>

[Measurement of Anti-Abrasion Property]

A 2 cm×2 cm probe to which a steel wool was adhered was put on the layer of the above sample films, loaded with a 500 g load, and reciprocated 10 times. The number of abrasion lines was counted. Results were listed in Table 1.

A: No abrasion line was observed.
B: Several abrasion lines were observed.
C: 10-49 abrasion lines were observed.
D: 50 or more abrasion lines were observed.

[Evaluation of Curling]

Sample films cut into A4 size were stored 50 hours at 80° C., 60% R.H., then humidity controlled 24 hours at 23° C., 55% R.H., and placed on the flat desk. The length of elevation of each of the four corners from the desk was measured, with sign of + in the case of surface side facing upward and − for in the case of rear side facing upward. Maximum value of the absolute value was used as an index for the evaluation of curling. The rounded piece was defined as "incapable of measurement." The results are shown in Table 1.

A: The length of elevation was less than ±0.5 cm.
B: The length of elevation was ±0.5 cm or more and ±1.0 cm.
C: The length of elevation was ±1.0 cm or more and ±2.0 cm.
D: The length of elevation was ±2.0 cm or more.

TABLE 1

| Sample No. | Content of ZrO₂ Transparent electrode side (H1) (vol %) | Content of ZrO₂ Opposite side (H2) (vol %) | Hard coat Refractive index n(H1) | Hard coat Refractive index n(H2) | Hard coat Coating thickness d(H1) (μm) | Hard coat Coating thickness d(H2) (μm) | Scratch resistance | Curling |
|---|---|---|---|---|---|---|---|---|
| 101 | 30 | 30 | 1.75 | 1.75 | 5 | 5 | A | A |
| 102 | 30 | 30 | 1.75 | 1.75 | 5 | 2 | A | B |
| 103 | 30 | 30 | 1.75 | 1.75 | 5 | 1 | B | C |
| 104 | 30 | 30 | 1.75 | 1.75 | 20 | 5 | A | C |
| 105 | 30 | 30 | 1.75 | 1.75 | 10 | 5 | A | B |
| 106 | 20 | 20 | 1.70 | 1.70 | 5 | 5 | B | B |
| 107 | 10 | 10 | 1.65 | 1.65 | 5 | 5 | B | B |
| 108 | 0 | 0 | 1.60 | 1.60 | 5 | 5 | B | B |
| 109 | — | — | — | — | — | — | D | D |
| 110 | 10 | 30 | 1.65 | 1.75 | 5 | 5 | A | B |
| 111 | 30 | 10 | 1.75 | 1.65 | 5 | 5 | B | B |
| 112 | 8 | 8 | 1.62 | 1.62 | 5 | 5 | B | B |
| 113 | 8 | 30 | 1.62 | 1.75 | 5 | 5 | A | C |
| 114 | 30 | 8 | 1.75 | 1.62 | 5 | 5 | B | C |
| 115 | 5 | 30 | 1.60 | 1.75 | 5 | 5 | A | D |
| 116 | 30 | 5 | 1.75 | 1.60 | 5 | 5 | B | D |
| 117 | 10 | 10 | 1.65 | 1.65 | 5 | 5 | B | B |
| 118 | 30 | 30 | 1.75 | 1.75 | 5 | 5 | A | A |
| 119 | 10 | 30 | 1.65 | 1.75 | 5 | 5 | A | B |
| 120 | 30 | 10 | 1.75 | 1.65 | 5 | 5 | B | B |
| 121 | 8 | 8 | 1.62 | 1.62 | 5 | 5 | B | B |
| 122 | 8 | 30 | 1.62 | 1.75 | 5 | 5 | A | C |
| 123 | 30 | 8 | 1.75 | 1.62 | 5 | 5 | B | C |

By reference to Patent Document 5, prepared was a transparent film sample with a hard coat layer having a gradient refractive index structure. However, it was found that it exhibits extremely poor anti-abrasion property and curling, comparing to other transparent films with a hard coat layer.

Example 2

ITO (indium tin oxide; refractive index 1.85) of 100 nm was formed onto the above obtained Transparent film sample 101 with hard coat layer on both side to prepare a substrate. After patterning, the substrate with ITO transparent electrode was ultrasonic washed by isopropyl alcohol, dried by dry nitrogen gas and then washed 5 minutes by using UV ozone. Poly(3,4-ethylenedioxythiophene)-polystyrene sulfonate (PEDOT/PSS, Baytron P AI 4083, made by Bayer) was diluted to 70% by adding pure water. Hole injecting layer with the coating thickness of 30 nm was produced by applying thus prepared coating solution with a spin coater at 3000 rpm for 30 seconds on the substrate so that, and dried at 200° C. of a substrate surface temperature for 1 hour.

Based on JIS B 9920, the substrate was moved under a nitrogen atmosphere into a globe box which has cleanliness class 100, dew point –80° C. or less and oxygen concentration of 0.8 ppm. In the globe box, a coating solution of hole transporting layer was prepared as follow and coated with a spin coater at 1500 rpm for 30 seconds. Further it was heated at 150° C. of a substrate surface temperature for 30 minutes to prepare a hole transporting layer. The coating was performed under the same condition on a substrate separately prepared, and the thickness of the film was measured to be 20 nm.
(Coating Solution of Hole Transporting Layer)

| | |
|---|---|
| Monochlorobenzene | 100 g |
| Poly-(N,N'-bis(4-butylphenyl)-N,H7-bis(phenyl) benzidine (ADS254BE: produced by American Dye Source, Inc.) | 0.5 g |

Subsequently, a coating solution of light emission layer was prepared as follow and coated with a spin coater at 2000 rpm for 30 seconds. Further it was heated at 120° C. of a substrate surface temperature for 30 minutes to prepare a light emission layer. The coating was performed under the same condition on a substrate separately prepared, and the thickness of the film was measured to be 40 nm. Herein, among compositions for light emission layer below, H-A showed the lowest Tg as 132° C.
(Coating Solution of Light Emission Layer)

| | |
|---|---|
| Butylacetate | 100 g |
| H-A | 1 g |
| D-A | 0.11 g |
| D-B | 0.002 g |
| D-C | 0.002 g |

Subsequently, a coating solution of electron transporting layer was prepared as follow and coated with a spin coater at 1500 rpm for 30 seconds. Further it was heated at 120° C. of a substrate surface temperature for 30 minutes to prepare an electron transporting layer. The coating was performed under the same condition on a substrate separately prepared, and the thickness of the film was measured to be 30 nm.
(Coating Solution of Electron Transporting Layer)

| | |
|---|---|
| 2,2,3,3,-tetrafluoro-1-propanpol | 100 g |
| ET-A | 0.75 g |

The substrate having been prepared until the electron transport layer was transferred into a vapor deposition apparatus without being exposed to the air and the pressure was reduced to $4 \times 10^{-4}$ Pa. Previously, there have been installed tantalum resistance heating boats containing potassium fluoride and aluminum each therein in the vapor deposition apparatus.

First, the resistance heating boat containing potassium fluoride was heated via application of electric current and deposition of potassium fluoride was carried out onto the substrate to form an electron injection layer of lithium fluoride layer having a thickness of 3 nm. Then, the resistance heating boat containing aluminum was heated via application of electric current and deposition was carried at a deposition rate of 1 to 2 nm/second, to produce a cathode having a thickness of 100 nm.

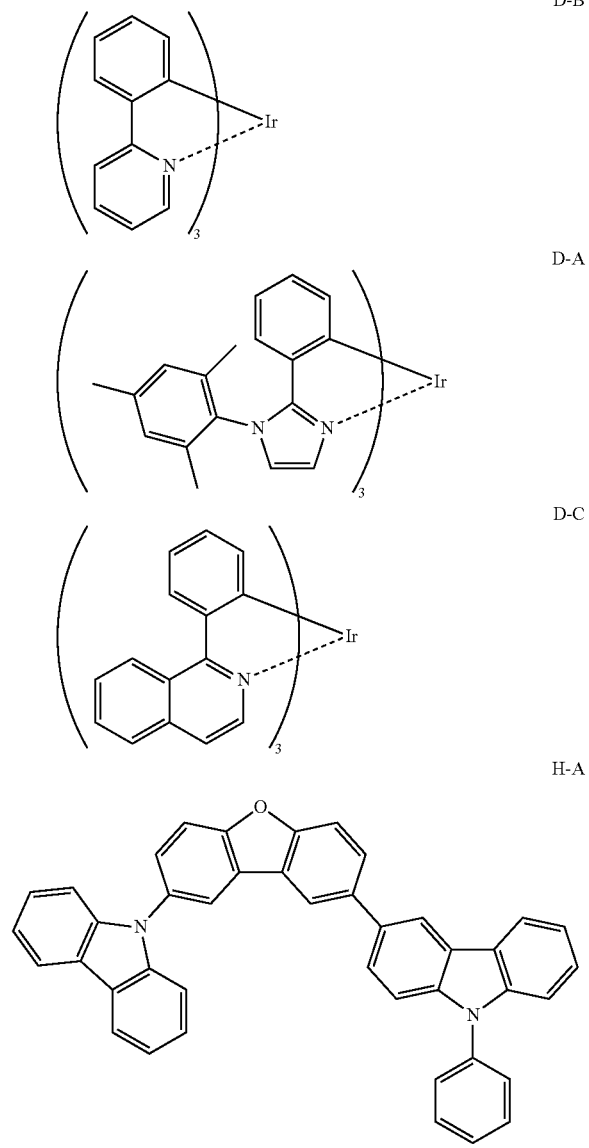

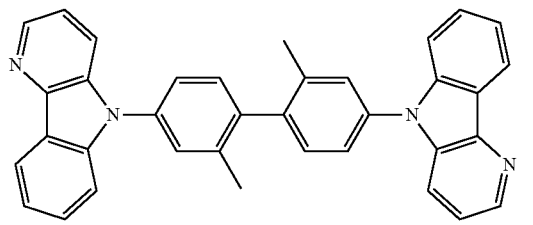

(Application of Light Takeout Member)

Organic electroluminescence element 201 was prepared by adhering the light diffusion film MTN-W1 (produced by Kimoto Co., Ltd.) to the light emission side of the obtained organic electroluminescence element using the adhesion layer.

<<Preparation of Organic Electroluminescence Elements 202-223>>

Organic electroluminescence elements 202-223 were prepared in the same manner as Organic electroluminescence element 201 except for changing the transparent resin substrate 101 to transparent resin substrate 102-123 as shown in Table 2.

<<Evaluation of Organic Electroluminescence Element>>

[External Quantum Efficiency]

Electric current of 2.5 mA/cm$^2$ was supplied to each organic electroluminescence element sample in an atmosphere of a dry nitrogen gas, external quantum efficiency (%) of each sample was measured. The external quantum efficiency (%) was measured employing a spectral radiance luminance meter CS-1000 (produced by Minolta Co., Ltd.). External quantum efficiency in Table 2 was expressed by a relative value when external quantum efficiency of organic electroluminescence 101 was set at 100.

[Bending and Stretching Test]

Bending and stretching test was applied to a light emission portion of each organic electroluminescence element sample in an atmosphere of an inert gas, in which the sample was bended with light emission surface inside with radius 2 cm and stretched repeatedly 10 times. A state of the light emission before and after the bending and stretching test was visually inspected and ranked according to the following criteria. Results were listed in Table 2.

A: Uniform emission without bright point and dark point was observed.

B: Bright point or dark point was observed, but the emission was stable.

C: Bright point or dark point was observed, and the emission was unstable.

D: No emission was observed.

Results were listed in Table 2. By observing the cross section of the portion where bright point and dark point was observed, it was found that the layer was peeled at the boundary of the hard coat layer and ITO.

TABLE 2

| Element No. | Refractive index ITO (A) | Refractive index Film (B) | Transparent film with Hard coat layer | Refractive index of Hard coat layer n(H1) | Refractive index of Hard coat layer n(H2) | Thickness of Hard coat layer d(H1) (μm) | Thickness of Hard coat layer d(H2) (μm) | External quantum efficiency | Bend and Stretch Test Before test | Bend and Stretch Test After test | Remarks |
|---|---|---|---|---|---|---|---|---|---|---|---|
| 201 | 1.85 | 1.75 | 101 | 1.75 | 1.75 | 5 | 5 | 100 | A | A | Inv. |
| 202 | 1.85 | 1.75 | 102 | 1.75 | 1.75 | 5 | 2 | 98 | A | B | Inv. |
| 203 | 1.85 | 1.75 | 103 | 1.75 | 1.75 | 5 | 1 | 98 | A | C | Inv. |

TABLE 2-continued

| Element No. | Refractive index ITO (A) | Refractive index Film (B) | Transparent film with Hard coat layer | Refractive index of Hard coat layer n(H1) | Refractive index of Hard coat layer n(H2) | Thickness of Hard coat layer d(H1) (μm) | Thickness of Hard coat layer d(H2) (μm) | External quantum efficiency | Bend and Stretch Test Before test | Bend and Stretch Test After test | Remarks |
|---|---|---|---|---|---|---|---|---|---|---|---|
| 204 | 1.85 | 1.75 | 104 | 1.75 | 1.75 | 20 | 5 | 102 | B | C | Inv. |
| 205 | 1.85 | 1.75 | 105 | 1.75 | 1.75 | 10 | 5 | 99 | A | B | Inv. |
| 206 | 1.85 | 1.75 | 106 | 1.70 | 1.70 | 5 | 5 | 94 | A | B | Inv. |
| 207 | 1.85 | 1.75 | 107 | 1.65 | 1.65 | 5 | 5 | 91 | A | B | Inv. |
| 208 | 1.85 | 1.75 | 108 | 1.60 | 1.60 | 5 | 5 | 76 | A | B | Comp. |
| 209 | 1.85 | 1.75 | 109 | — | — | — | — | 95 | B | C | Comp. |
| 210 | 1.85 | 1.75 | 110 | 1.65 | 1.75 | 5 | 5 | 92 | A | B | Inv. |
| 211 | 1.85 | 1.75 | 111 | 1.75 | 1.65 | 5 | 5 | 94 | A | B | Inv. |
| 212 | 1.85 | 1.75 | 112 | 1.62 | 1.62 | 5 | 5 | 81 | A | C | Comp. |
| 213 | 1.85 | 1.75 | 113 | 1.62 | 1.75 | 5 | 5 | 80 | A | C | Comp. |
| 214 | 1.85 | 1.75 | 114 | 1.75 | 1.62 | 5 | 5 | 83 | A | C | Comp. |
| 215 | 1.85 | 1.75 | 115 | 1.60 | 1.75 | 5 | 5 | 74 | A | D | Comp. |
| 216 | 1.85 | 1.75 | 116 | 1.75 | 1.60 | 5 | 5 | 78 | A | C | Comp. |
| 217 | 1.85 | 1.65 | 117 | 1.65 | 1.65 | 5 | 5 | 90 | A | C | Inv. |
| 218 | 1.85 | 1.65 | 118 | 1.75 | 1.75 | 5 | 5 | 92 | A | A | Inv. |
| 219 | 1.85 | 1.65 | 119 | 1.65 | 1.75 | 5 | 5 | 92 | A | B | Inv. |
| 220 | 1.85 | 1.65 | 120 | 1.75 | 1.65 | 5 | 5 | 91 | A | B | Inv. |
| 221 | 1.85 | 1.65 | 121 | 1.62 | 1.62 | 5 | 5 | 82 | A | C | Comp. |
| 222 | 1.85 | 1.65 | 122 | 1.62 | 1.75 | 5 | 5 | 80 | A | C | Comp. |
| 223 | 1.85 | 1.65 | 123 | 1.75 | 1.62 | 5 | 5 | 81 | A | D | Comp. |

Inv.: Inventive example, Comp.: Comparative example

By reference to Patent Document 5, prepared was an organic electroluminescence element sample with a hard coat layer having a gradient refractive index structure. However, it was found that it exhibits extremely poor emission state and cannot be evaluated.

Further, prepared were film substrates in which zirconia particles having an average diameter of 500 nm were used instead of the fine particles added in the hard coat layer in Examples 1 and 2. However, the hard coat layer became hazy and a lot of cracks occurred, whereby it cannot be evaluated.

Example 3

Organic electroluminescence element 301 was prepared in the same manner as Organic electroluminescence element 201 in Example 2, except for adding 2% by mass of PMMA filler having 1.5 μm diameter instead of using the light takeout member (the light diffusion film MTN-W1 (produced by Kimoto Co., Ltd.)). Similarly, Organic electroluminescence element 302 was prepared in the same manner as Organic electroluminescence element 201, except for using a film in which 2% by mass of PMMA filler having diameter of 1.5 μm was added instead of using the light takeout member. The same evaluation was carried out as Example 2 and results were listed in Table 3. Herein, Organic electroluminescence element 303 was used as a reference element which was prepared in the same manner as Organic electroluminescence element 201, except for without using the light takeout member.

TABLE 3

| | External quantum efficiency | Bending and Stretching Test Before test | Bending and Stretching Test After test | Remarks |
|---|---|---|---|---|
| 201 | 100 | A | A | Inv. |
| 301 | 98 | A | B | Inv. |
| 302 | 98 | A | A | Inv. |
| 303 | 57 | A | A | Comp. | inv.: Inventive example,
Comp.: Comparative example

Example 4

Organic electroluminescence element 201 prepared in Example 2 was covered by a glass case to prepare an illumination device. Nitrogen gas was filled inside of the glass cover and desiccant was provided inside of the glass cover at the opposite side of the light emission.

The illumination device of the present invention exhibits high light emission efficiency and can be used as a thin type illumination device which emits white color light having long emission lifetime.

Example 5

Organic electroluminescence element 201 prepared in Example 2 was covered by a transparent barrier film (a transparent film coated by silicon dioxide layer) to prepare a flexible illumination device. The illumination device of the present invention exhibits high light emission efficiency against some bend and can be used as a thin type illumination, device which emits white color light having long emission lifetime.

What is claimed is:
1. An organic electroluminescence element comprising:
a transparent substrate sequentially provided thereon, a transparent electrode, an organic electroluminescence layer and a cathode, wherein
the transparent substrate is a transparent resin film having a hard coat layer on both sides,
the transparent resin film having a refractive index in a range of not less than 1.70 and not more than 1.80,
the hard coat layer comprises a resin containing microparticles having a particle diameter of 1-400 nm in an amount of 5-30% by volume and a light scattering, polymer filler,
each refractive index of the hard coat layer satisfies Expressions (1)-(4),
the transparent substrate has a function to scatter a light to the light emission side with respect to the organic electroluminescence layer;

$$-0.2 \leq n(H1) - n(A) \leq 0.2 \quad \text{Expression (1)}$$

$$-0.1 \leq n(H1) - n(B) \leq 0.1 \quad \text{Expression (2)}$$

$$-0.1 \leq n(H2)-n(B) \leq 0.1 \quad \text{Expression (3)}$$

$$-0.1 \leq n(H1)-n(H2) \leq 0.1, \text{ wherein} \quad \text{Expression (4)}$$

n(A) is a refractive index of the transparent electrode;
n(H1) is a refractive index of the hard coat layer (on the transparent electrode side);
n(H2) is a refractive index of the hard coat layer (on an opposite side to the transparent electrode); and
n(B) is a refractive index of the transparent resin film.

2. The organic electroluminescence element of claim 1, wherein the resin is a curable resin.

3. The organic electroluminescence element of claim 1, wherein the transparent resin film is a film containing a light scattering filler.

4. The organic electroluminescence element of claim 1 comprising a light extraction film on an opposite side to the transparent electrode on the transparent substrate.

5. The organic electroluminescence element of claim 1, wherein the transparent resin film is a polyester film.

6. The organic electroluminescence element of claim 1, wherein the transparent resin film is a stretched polyethylene naphthalate film.

7. The organic electroluminescence element of claim 1, wherein
a thickness of the hard coat layer is not less than 2 μm and not more than 50 μm, and
satisfies Expressions (5)-(7):

$$d(H1) > d(A) \quad \text{Expression (5)}$$

$$d(H1) < d(B) \quad \text{Expression (6)}$$

$$-10 \text{ μm} \leq d(H2)-d(H1) \leq +10 \text{ μm, wherein} \quad \text{Expression (7)}$$

d(A) is a thickness of the transparent electrode;
d(H1) is a thickness of the hard coat layer (on the transparent electrode side);
d(H2) is a thickness of the hard coat layer (on the opposite side to the transparent electrode); and
d(B) is a thickness of the transparent resin film.

8. An illumination device comprising the organic electroluminescence element of claim 1.

9. The organic electroluminescence element of claim 1, wherein the light scattering, polymer filler is made of a silicone resin, a fluorine resin or an acrylic resin.

* * * * *